(12) United States Patent
Nedovic

(10) Patent No.: US 8,686,775 B2
(45) Date of Patent: Apr. 1, 2014

(54) PIECEWISE LINEAR PHASE INTERPOLATOR

(75) Inventor: Nikola Nedovic, San Jose, CA (US)

(73) Assignee: Fujitsu Limited, Kawasaki-shi (JP)

( * ) Notice: Subject to any disclaimer, the term of this patent is extended or adjusted under 35 U.S.C. 154(b) by 5 days.

(21) Appl. No.: 13/241,040

(22) Filed: Sep. 22, 2011

(65) Prior Publication Data
US 2013/0076419 A1    Mar. 28, 2013

(51) Int. Cl.
*H03K 3/00* (2006.01)

(52) U.S. Cl.
USPC ............ 327/231; 327/237; 327/355; 327/357

(58) Field of Classification Search
USPC ......... 327/231, 235, 237, 238, 240, 246, 247, 327/253, 256, 258–259, 355, 357; 375/283, 375/330, 362, 375–376
See application file for complete search history.

(56) References Cited

U.S. PATENT DOCUMENTS

| | | | |
|---|---|---|---|
| 6,509,773 B2 | 1/2003 | Buchwald et al. | |
| 7,135,903 B2 * | 11/2006 | Kizer et al. | 327/159 |
| 7,928,788 B2 * | 4/2011 | Jiang | 327/231 |
| 8,184,029 B1 * | 5/2012 | Hsieh et al. | 341/144 |
| 2010/0109734 A1 | 5/2010 | Rylov | |

OTHER PUBLICATIONS

Takauchi, H. et al., "A CMOS Multichannel 10-Gb/s Transceiver", IEEE JSSC, v. 38, n.12, Dec. 2003.

* cited by examiner

*Primary Examiner* — An Luu
(74) *Attorney, Agent, or Firm* — Baker Botts L.L.P.

(57) ABSTRACT

In one embodiment, a phase interpolator with a phase range of n degrees, where $0<n\leq 360$, and having m reference signals, where $m\geq 2$, and a control signal as input, and producing an output signal with a phase within the phase range using one or more of the m reference signals based on a control code provided by the control signal. The phase interpolator comprises one or more circuits configured to: divide the phase range of n degrees into k sections, wherein $k>m$; and for each of the k sections, select a relative gain of one or more weights assigned to the one or more reference signals, respectively, with respect to the control code provided by the control signal.

12 Claims, 9 Drawing Sheets

PHASE MIXERS

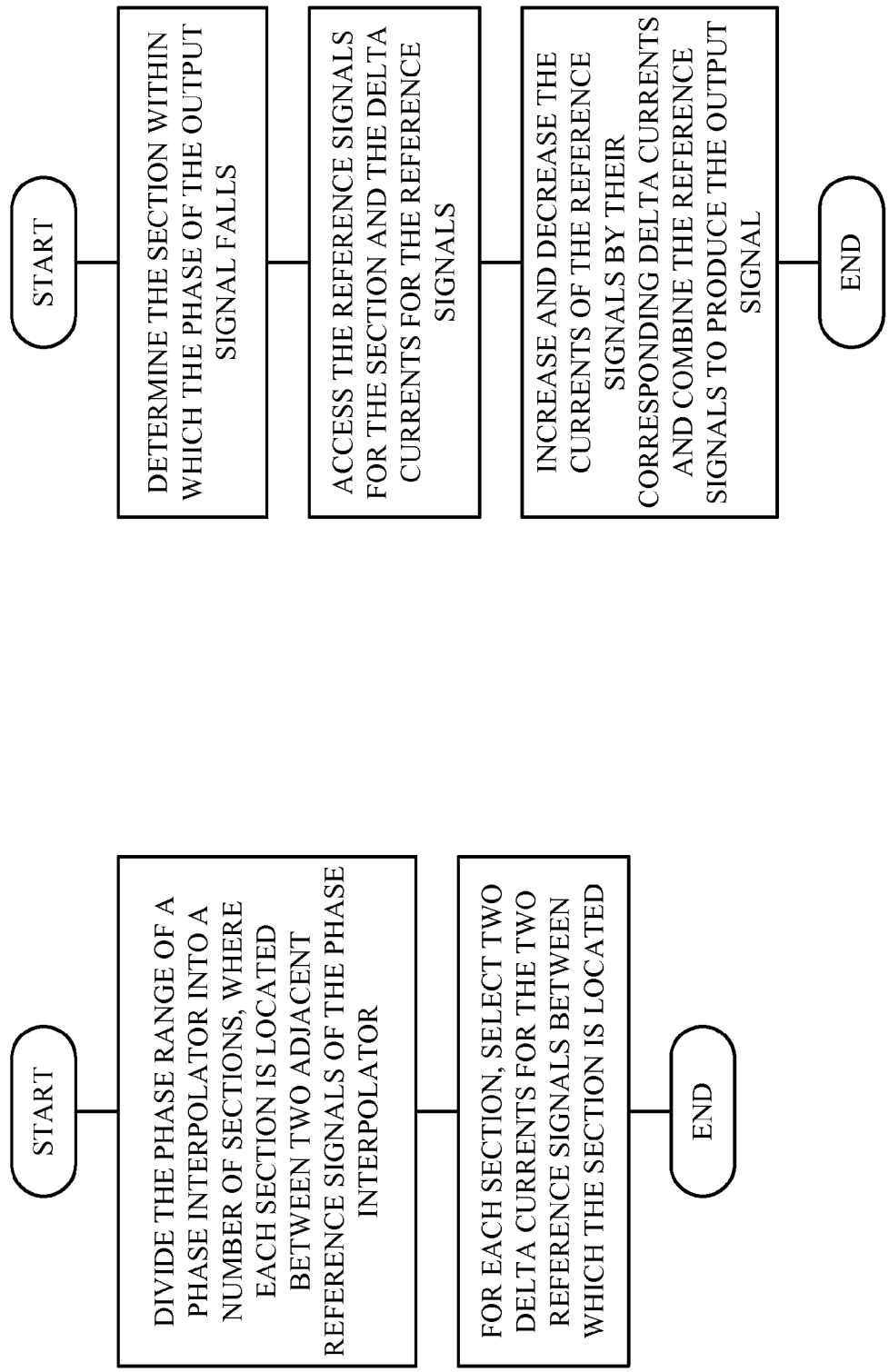

US 8,686,775 B2

PIECEWISE LINEAR PHASE INTERPOLATOR

TECHNICAL FIELD

This disclosure generally relates to linear phase interpolators.

BACKGROUND

A phase interpolator outputs periodical signals based on a set of reference signals and a control signal as its input. The control signal controls the phases of the output signals, and is typically a digital signal. A phase interpolator with a digital control signal produces output signals having discrete phases. Phase interpolators may be used in a variety of systems, such as radio frequency (RF) receivers, and Plesiochronous or Mesochronous communications systems.

BRIEF DESCRIPTION OF THE DRAWINGS

FIG. 9 illustrates an example method for constructing a phase interpolator.

FIG. 10 illustrates an example method for producing an output signal having a specific phase.

DESCRIPTION OF EXAMPLE EMBODIMENTS

A phase interpolator outputs periodical signals based on a set of reference signals and a control signal as its input. Each reference signal has an amplitude and a phase. The control signal controls the phases of the output signals. The functionality of the phase interpolator is to set the phase of an output signal to track the digital control code provided by the control signal at its input. Hereafter, let A denote the amplitude (e.g., as in current in units of amperes (A) or voltage in units of volts (V)) of a signal and $\phi$ denote the phase (in degrees (°)) of a signal.

Figure 1:
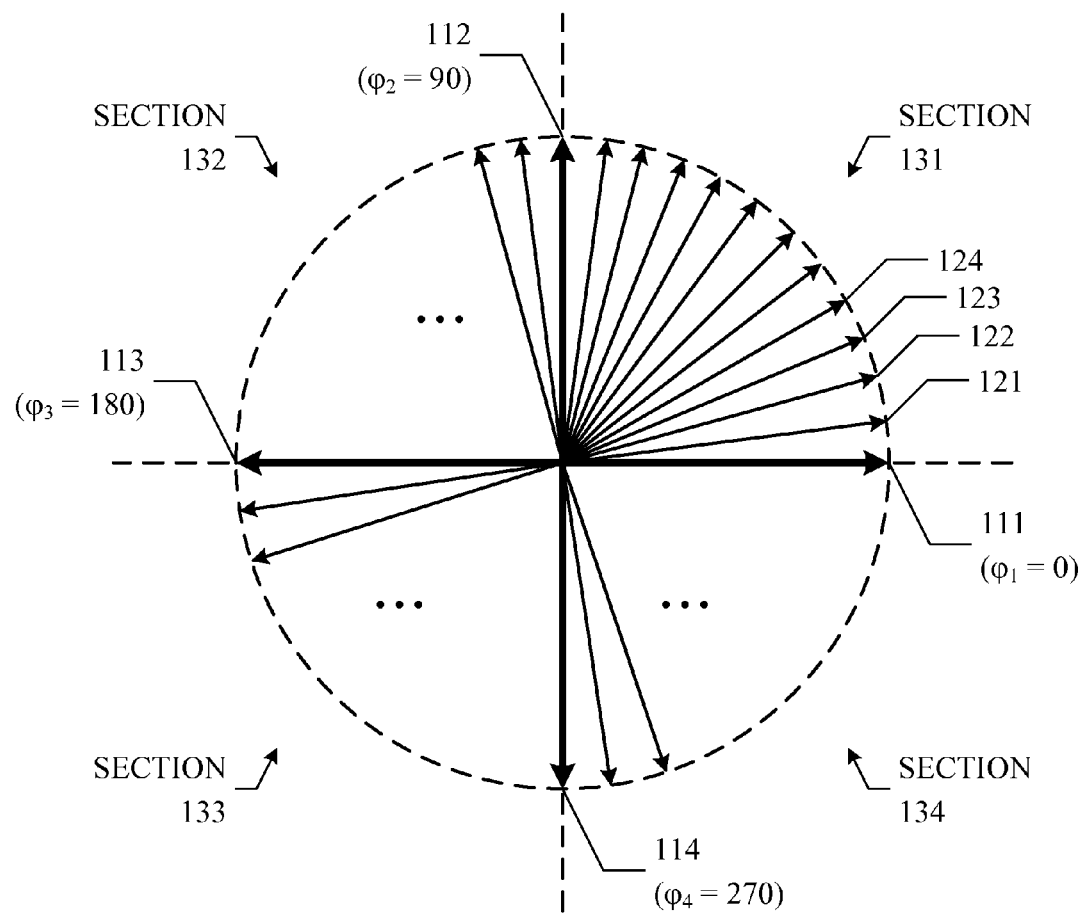
FIG. 1 illustrates an example phase interpolator having a phase range of 360° and four reference signals, and an ideal output signal having a number of phases.

FIG. 1 illustrates an example phase interpolator in an ideal scenario. In this case, the phase range, denoted as P, of the phase interpolator is 360° (i.e., 0≤P<360); that is, the phase interpolator is capable of providing output signals having a phase that belongs to a set of discrete phases in range between 0° and 360°. For a phase interpolator having a phase range of 360°, the minimum number of reference signals the phase interpolator needs is three, but such a phase interpolator can have any number of reference signals that is greater than or equal to three (e.g., three, four, six, etc.). Often, for practical reasons, four reference signals are used with a phase interpolator having a phase range of 360°. As illustrated in FIG. 1, four reference signals, denoted as 111, 112, 113, and 114, are used as input to the phase interpolator, each having a fixed amplitude and a fixed phase. More specifically, reference signal 111 has a fixed phase of 0°; reference signal 112 has a fixed phase of 90°; reference signal 113 has a fixed phase of 180°; and reference signal 114 has a fixed phase of 270°. In addition, each reference signal 111, 112, 113, 114 has a fixed amplitude, and in this case, the four reference signals 111, 112, 113, 114 have the same amplitude level. The phase interpolator has a digital control signal, and is capable of outputting a multitude of signals, each having specific and discrete phases within the phase range P of the phase interpolator (e.g., phases 121, 122, 123, 124, . . . ), by using the digital control signal. In other words, an output signal can be set to a number of different phases (e.g., phases 121, 122, 123, 124, . . . ). Typically, but not necessarily, the same digital control signal is used for each output so that there is a fixed phase difference between the adjacent output signal phases equidistantly spaced in the phase range P. In FIG. 1, each signal (reference or output) is represented by a directed line segment. The angle of the line segment around the circle corresponds to the phase $\phi$ of the signal, and the length or magnitude of the line segment corresponds to the amplitude A of the signal. Note that since an output signal can be set to a number of different phases, in FIG. 1, line segments 121, 122, 123, 124, . . . may represent the different phases of a specific output signal.

In particular embodiments, each output signal is produced by combining two reference signals, and more specifically, two adjacent reference signals. The term "adjacent" is with respect to the phases of the reference signals. For example, in the case illustrated in FIG. 1, reference signals 111 and 112 are adjacent to each other; reference signals 112 and 113 are adjacent to each other; reference signals 113 and 114 are adjacent to each other; and reference signals 114 and 111 are adjacent to each other. However, reference signals 111 and 113 are not adjacent to each other; and similarly, reference signals 112 and 114 are not adjacent to each other.

In FIG. 1, the four reference signals 111, 112, 113, 114 divide the entire phase range P (e.g., 360°) of the phase interpolator into four equal sections 131, 132, 133, 134. More specifically, section 131 covers phases between 0° and 90°; section 132 covers phases between 90° and 180°; section 133 covers phases between 180° and 270°; and section 134 covers phases between 270° and 360°. In particular embodiments, an output signal having a phase $\phi$ within section 131 is produced by combining reference signals 111 and 112; an output signal having a phase $\phi$ within section 132 is produced by combining reference signals 112 and 113; an output signal having a phase $\phi$ within section 133 is produced by combining reference signals 113 and 114; and an output signal having a phase $\phi$ within section 134 is produced by combining reference signals 114 and 111.

In an ideal scenario, if the reference signals all have the same amplitude, then all phases (or positions) of each output signal should have equal amplitudes. In addition, the phase differences between every two adjacent phases of the output signal (controlled by the adjacent settings of the digital control code) around the phase range P (e.g., the circle) should be the same. For example, in the case illustrated in FIG. 1, given an output signal set to different phases 121, 122, 123, 124, . . . , the difference between phase 121 and phase 122 should be the same as the difference between phase 122 and phase 123, which should be the same as the difference between phase 123 and phase 124, and so on. In other words, in an ideal scenario, output signal phases 121, 122, 123, 124, . . . should be evenly distributed and positioned around the phase range P (e.g., the circle). In addition, for the output signal, the amplitude at phase 121 should equal to the amplitude at phase 122, which should equal to the amplitude at phase 123, which should equal to the amplitude at phase 124, and so on.

Figure 2:
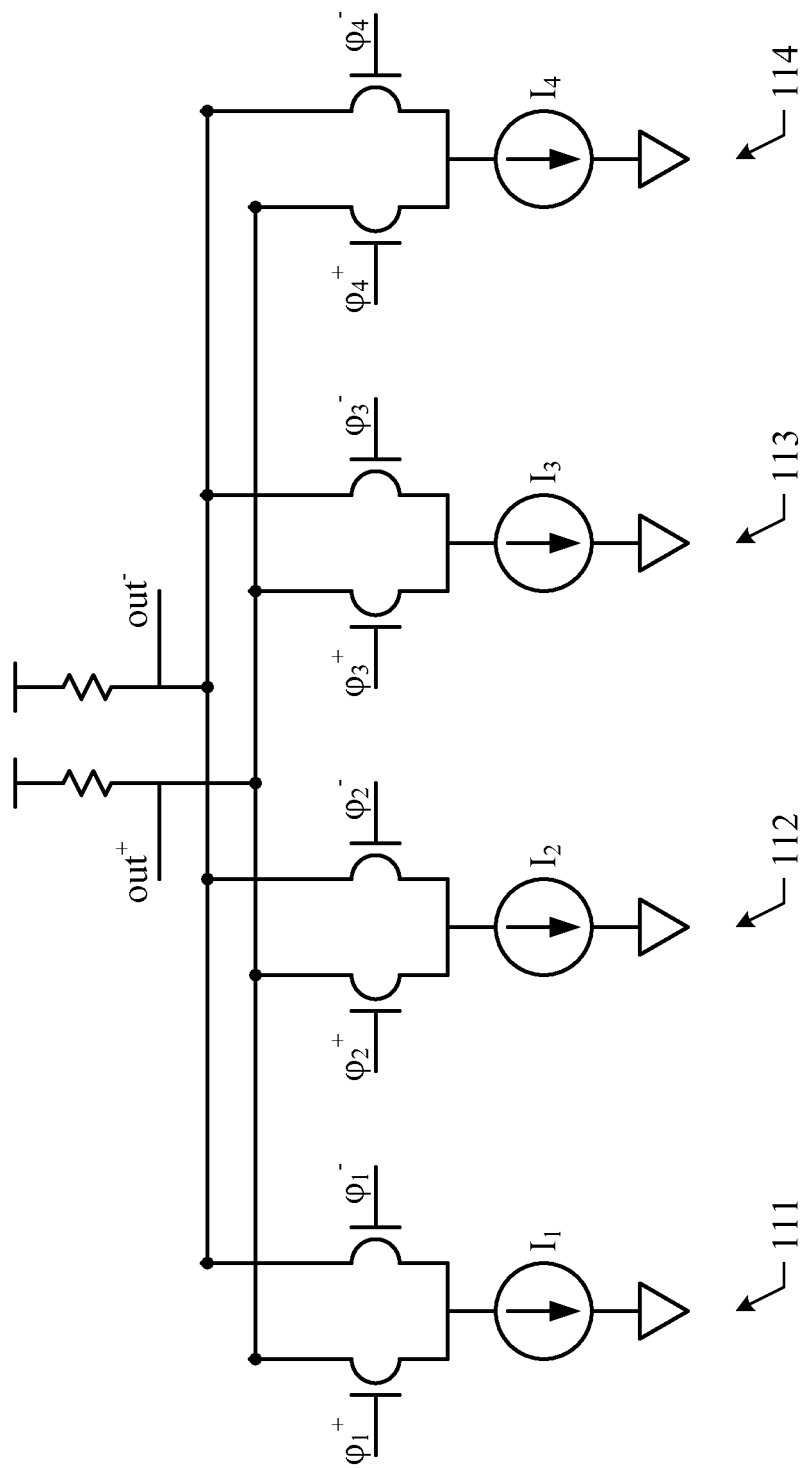
FIG. 2 illustrates an example implementation of a phase interpolator.

In practice, however, for a specific output signal, its different signal phases produced by a phase interpolator are often less than ideal. In particular embodiments, a phase interpolator may be implemented as electronic or integrated circuits. FIG. 2 illustrates an example circuit implementation of the phase interpolator illustrated in FIG. 1. The four reference signals 111, 112, 113, 114 have four fixed amplitudes $A_1, A_2, A_3, A_4$ and four fixed phases $\phi_1, \phi_2, \phi_3, \phi_4$, respectively. To produce an output signal having phases within section 131, reference signals 111 and 112 are turned on, while reference signals 113 and 114 are turned off. To produce an output signal having phases within section 132, reference signals 112 and 113 are turned on, while reference signals 111 and 114 are turned off. To produce an output signal having phases within section 133, reference signals 113 and 114 are turned on, while reference signals 111 and 112 are turned off. To produce an output signal having phases within section 134, reference signals 114 and 111 are turned on, while reference signals 112 and 113 are turned off.

In particular embodiments, the control signal is digital, and its value may be represented using, for example, a binary number. The number of bits used to represent the control signal determines how many different phases may be produced by a phase interpolator (i.e., how many different phases an output signal can be set to). The larger number of bits used to represent the control signal, the larger number of different phases can be produced by the phase interpolator, and vice versa. As one example, suppose that the control signal is represented using seven (7) bits. Applying this 7-bit control signal to the phase interpolator illustrated in FIG. 1, the higher two (2) bits may be used to represent the sections, while the lower five (5) bits may be used to represent the phases within each section. More specifically, for the higher two bits that represent the sections, "00" may indicate section 131 (between 0° and 90°); "01" may indicate section 132 (between 90° and 180°); "10" may indicate section 133 (between 180° and 270°); and "11" may indicate section 134 (between 270° and 360°). The lower five bits are used to represent the phases within each section, and five bits can represent up to 32 ($2^5=32$) distinct input values. Thus, with a 7-bit control signal, the phase interpolator can produce up to 128 ($4\times32=128$ or $2^7=128$) different output phases. In other words, a specific output signal can be set to 128 different phases.

In the case illustrated in FIG. 1, the phase range P is 360°, and each section 131, 132, 133, 134 has 90°. With a 7-bit control signal, in an ideal scenario, the 128 output phases are $$\left(\frac{360}{128}\right)^\circ \text{ or } \left(\frac{90}{32}\right)^\circ$$

apart. For example, "00 01110" corresponds to the output phase, in section 131, at $$\left(\frac{90\times14}{32}\right)^\circ,$$

while "10 10000" corresponds to the output phase, in section 133, at $$\left(180+\frac{90\times16}{32}\right)^\circ.$$

As another example, if the control signal is represented by five (5) bits with the higher two bits representing the sections and the lower three bits representing the phases within each section, then, applying this 5-bit control signal to the phase interpolator illustrated in FIG. 1, the phase interpolator can produce up to 32 output signals having phases that are $$\left(\frac{360}{32}\right)^\circ \text{ or } \left(\frac{90}{8}\right)^\circ$$

apart. On the other hand, if the control signal is represented by nine (9) bits with the higher two bits representing the sections and the lower seven bits representing the phases within each section, then, again applying this 9-bit control signal to the phase interpolator illustrated in FIG. 1, the phase interpolator can produce up to 512 output signals having phases that are $$\left(\frac{360}{512}\right)^\circ \text{ or } \left(\frac{90}{128}\right)^\circ$$

apart.

Figure 3:
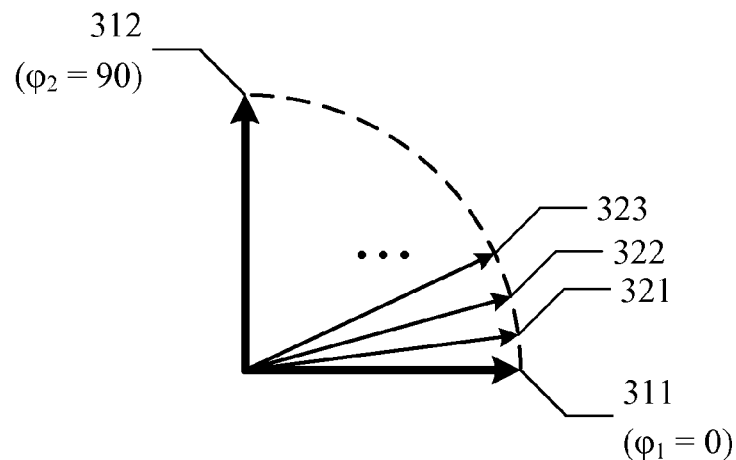
FIG. 3 illustrates an example phase interpolator having a phase range of 90° and two reference signals.

Note that the phase range P of a phase interpolator is not necessarily always 360°, but may be less than 360°. For example, a phase interpolator may have a phase range P of only 90°, as illustrated in FIG. 3, and there may be only two reference signals 311, 312 as input to this phase interpolator. More specifically, reference signal 311 has a fixed phase of 0°; and reference signal 312 has a fixed phase of 90°. In this case, the phase interpolator outputs signals having phases 321, 322, 323, . . . all between 0° and 90°.

Figure 4:
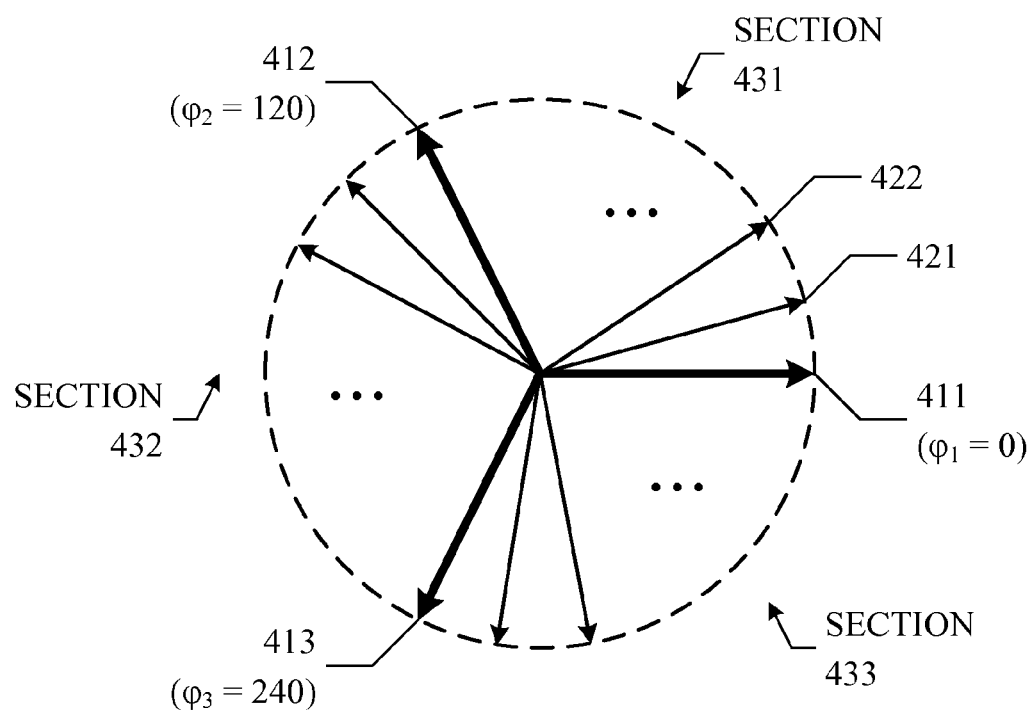
FIG. 4 illustrates an example phase interpolator having a phase range of 360° and three reference signals.

Moreover, in general, a phase interpolator (e.g., a phase interpolator having a phase range P of 90°, as illustrated in FIG. 3) may have two or more reference signals as its input. A phase interpolator with a phase range P of 360° may have three or more reference signals as its input. For example, FIG. 4 illustrates a phase interpolator having a phase range P of 360° and three reference signals 411, 412, 413. These three reference signals 411, 412, 413 divide the phase range P (e.g., 360°) of the phase interpolator into three sections 431, 432, 433. Section 431 covers 0° to 120°; section 432 covers 120° to 240°; and section 433 covers 240° to 360°. Output signals having phases within section 431 (e.g., signal phases 421, 422, . . . ) are produced by combining reference signals 411 and 412. Output signals having phases within section 432 are produced by combining reference signals 412 and 413. Output signals having phases within section 433 are produced by combining reference signals 413 and 411.

To further explain how an output signal having different phases is produced by combining two adjacent reference signals, consider the implementation illustrated in FIG. 2. Suppose that reference signals 111, 112, 113, and 114 have equal amplitude and phases $\phi_1, \phi_2, \phi_3, \phi_4$, respectively. The phase interpolation is performed by mixing (or combining) the reference signals with the weights represented by the values of the corresponding current sources $I_1, I_2, I_3$, and $I_4$, respectively. The values of these currents depend on the digital control code so that for any control code, two of the current sources are turned off so that the corresponding two currents each have value 0, and the values of the remaining two current sources are set to represent the phase that the phase interpolator should produce.

In particular embodiments, to combine two adjacent reference signals to produce an output signal having specific phases located between them, each current source may be given a weight, and the sum of the weights for the two adjacent current sources may be kept constant. The weights of the two adjacent current sources may linearly increase or decrease for the different phases of the output signal located between the two adjacent reference signals. To do so, in some implementations, a delta current $\Delta I$ may be assigned to the least significant bit (LSB) of the digital control code such that as the digital control code increases (or decreases) by 1 LSB, the current source representing the weight of the early reference signal (e.g., $I_1$) decreases (or increases) by $\Delta I$, and the current source representing the weight of the late reference signal (e.g., $I_2$) increases (or decreases) by $\Delta I$. In this way, the total sum of the four weights selected for the four reference signals, respectively, remains equal for all digital control codes.

For example, consider section 131 illustrated in FIG. 1, where the output signal phases (e.g., phases 121, 122, 123, 124, . . . ) are produced by combining reference signals 111 and 112. As the value of the digital control code increases, the current $I_1$ of reference signal 111 is decreased by $\Delta I$ during each step, while the current $I_2$ of reference signal 112 is increased by $\Delta I$ during each step, causing the phases of an output signal to gradually move away from reference signal 111 and toward reference signal 112. Conversely, as the value of the digital control code decreases, the current $I_1$ of reference signal 111 is increased by $\Delta I$ during each step, while the current $I_2$ of reference signal 112 is decreased by $\Delta I$ during each step, causing the phases of the output signal to gradually move towards reference signal 111 and away from reference signal 112.

In the implementation illustrated in FIG. 2, the four different currents, $I_1$, $I_2$, $I_3$, and $I_4$, represent the four weights assigned to the four reference signals 111, 112, 113, and 114, respectively, when combining them to produce an output signal with varying phases as a function of the control code provided by the control signal. Note that there are other means to assign different weights to different reference signals (i.e., instead of using current sources), and this disclosure contemplates any applicable means to assign specific weights to specific reference signals. The delta current, $\Delta I$, represents the relative gain of the weights assigned to the reference signals.

The process may be similarly applied to sections 132, 133, 134, using the corresponding reference signals for each section, to produce output signals within each section.

Figure 5:
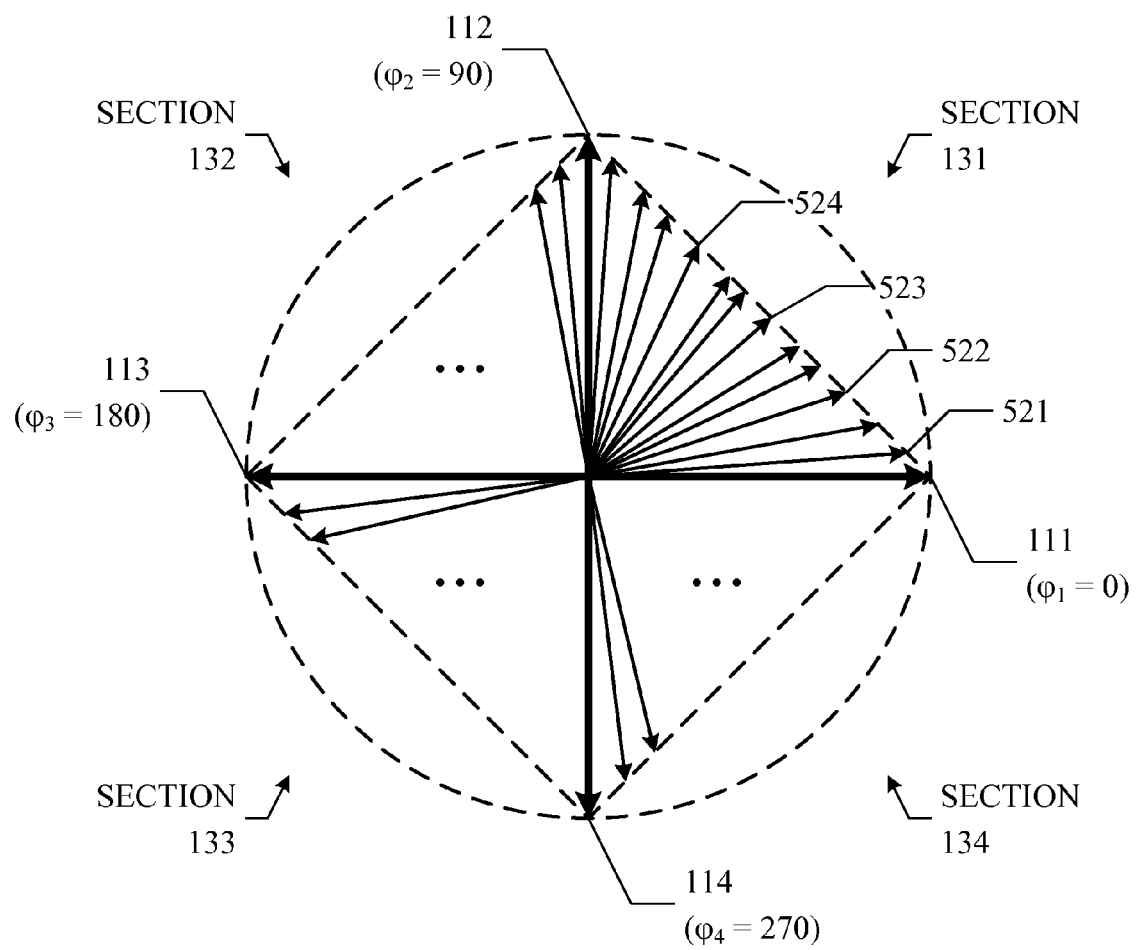
FIG. 5 illustrates an example phase interpolator having a phase range of 360° and four reference signals, and its practical output signals.

In practice, using a constant relative gain (e.g., represented as the delta current $\Delta I$) for the entire phase range P of a phase interpolator to adjust the weights assigned to the reference signals for different output phases often results in varying amplitudes for an output signal at different phases, which, in further buffering and other processing, can cause integral non-linearity (INL) and differential non-linearity (DNL), on top of the inherent INL and DNL due to the process variation and device matching. FIG. 5 illustrates an output signal set at phases 521, 522, 523, 524, . . . , in practice, produced by the phase interpolator illustrated in FIG. 1 using a constant relative gain (e.g., a constant delta current $\Delta I$) for the entire phase range P. The different phases 521, 522, 523, 524, . . . of the output signal have varying and different amplitude levels. For example, those output phases closer to reference signals 111, 112, 113, 114 have higher amplitude levels than those output phases farther away from reference signals 111, 112, 113, 114. In addition, output phases are not evenly and linearly distributed around the phase range. Some adjacent output phases are closer to each other, while other adjacent output phases are farther apart from each other.

To improve the output signals (i.e., their phases and the amplitudes at different phases) produced by a phase interpolator, in particular embodiments, different relative gains are selected for different reference signals. In the case illustrated in FIG. 1, where the relative gain is represented by delta currents, four delta currents $\Delta I_1$, $\Delta I_2$, $\Delta I_3$, $\Delta I_4$ may be selected for the four reference signals 111, 112, 113, 114, respectively. Each delta current, $\Delta I$, represents the gain of the corresponding weight with respect to the control code.

Figure 6:
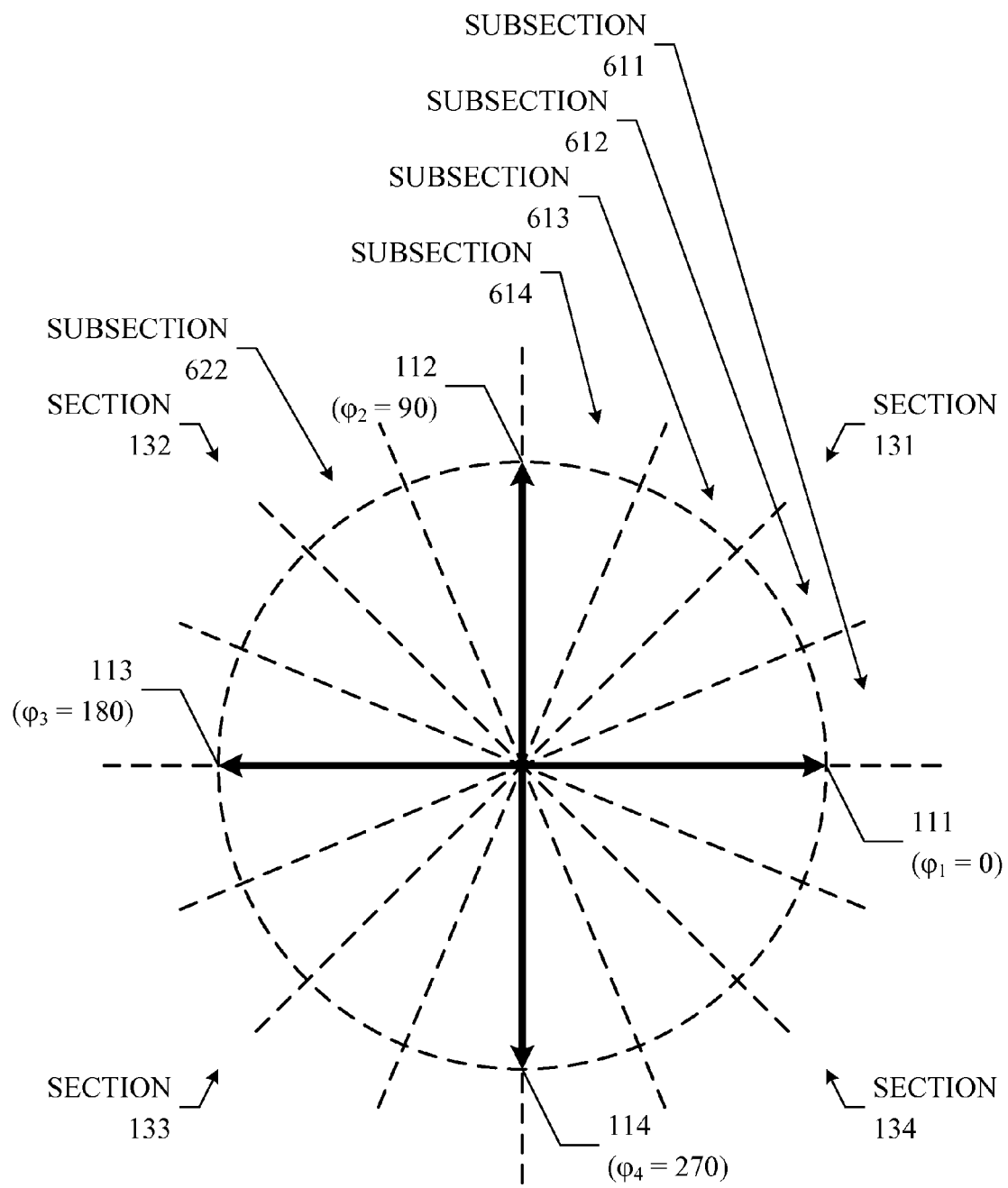
FIG. 6 illustrates an example phase interpolator where the phase range is divided into sections and subsections.

Moreover, in particular embodiments, as the reference signals divide the phase range P of a phase interpolator into a number of sections, each section is further divided into a number of subsections, and within each subsection, two delta currents are selected for the two adjacent reference signals between which the subsection is located. The two delta currents for each subsection may be independently selected so that different subsections may have different delta currents. In this way, the relative gain for the two selected adjacent reference signals (early and late) with respect to the input control code is chosen in each subsection independent of other subsections. Note that each section may be divided into any number of subsections, and the number of subsections in one section does not necessarily equal to the number of subsections in another section. Moreover, two subsections, either within the same section or in different sections, may or may not cover the same amount of phases. FIG. 6 illustrates a phase interpolator with its phase range P divided into sections and subsections. The phase interpolator illustrated in FIG. 6 is similar to that illustrated in FIG. 1. Its phase range P is 360° and there are four reference signals 111, 112, 113, 114 dividing the phase range into four sections 131, 132, 133, 134. Each section 131, 132, 133, 134 is further divided into four subsections. For example section 131 is divided into subsections 611, 612, 613, 614.

In this case, for subsection 611, which is located between reference signals 111 and 112, a delta current $\Delta I_{611-1}$ is selected for reference signal 111, and another delta current $\Delta I_{611-2}$ is selected for reference signal 112. Similarly, for subsection 612, two delta currents $\Delta I_{612-1}$ and $\Delta I_{612-2}$ are selected for reference signals 111 and 112, respectively. Note that $\Delta I_{611-1}$ may differ from $\Delta I_{612-1}$, even though both are delta currents selected for reference signal 111; and $\Delta I_{611-2}$ may differ from $\Delta I_{612-2}$, even though both are delta currents selected for reference signal 112. For subsection 622 within section 132, which is located between reference signals 112 and 113, two delta currents $\Delta I_{622-2}$ and $\Delta I_{622-3}$ are selected for reference signals 112 and 113, respectively. In the case illustrated in FIG. 6, there are a total of sixteen subsections, and thus, there may be sixteen pairs of delta currents, one for each subsection corresponding to the two adjacent reference signals between which that subsection is located. In particular embodiments, the sixteen pairs of delta currents may differ from each other.

For example, in one subsection, for the control code 12 (out of 128), a phase interpolator may assign a weight of 1 mA to reference signal 111, and a weight of 0.3 mA to reference signal 112. For the control code 13, the phase interpolator may assign a weight of 0.95 mA to reference signal 111 and a weight of 0.4 mA to reference signal 112. The relative gain (i.e., the ratio of the deltas) is 2 because the weight of reference signal 111 is dropped by 0.05 mA and the weight of reference signal 112 is increased 0.1 mA. It is these relative gains that are changed as the phases of the output signal progresses from one subsection to another. This is distinctively different from existing methods where this relative gain is always 1 or −1, depending on how it is defined (i.e., one reference signal is always increases the same amount as the other reference signal is decreased). In contrast, in particular embodiments, the amount one reference signal is increased may differ from the amount the other reference signal is decreased.

Figure 7:
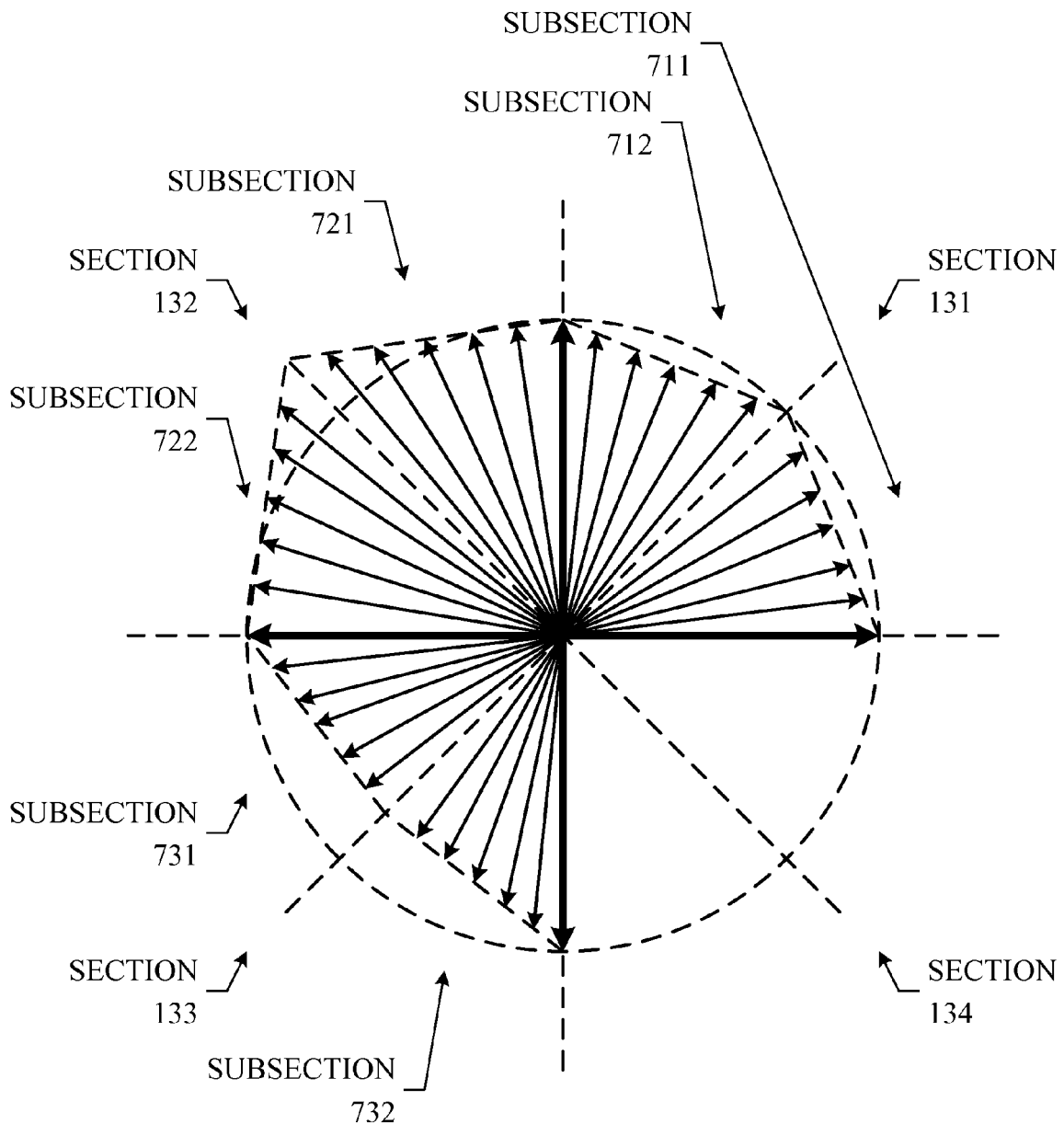
FIG. 7 illustrates several examples of controlling the output signals in different subsections by varying the delta currents for each subsection.

In particular embodiments, given a specific subsection, the two delta currents for the two adjacent reference signals between which the subsection is located may be selected based on experiments. Different values may be selected for the two delta currents to control the currents and phases of the output signals within that subsection. With some implementations, the goal is to approximate the ideal scenario of the output signals illustrated in FIG. 1 (circular phasor diagram). The more subsections created for each section, the finer control of the output signals the phase interpolator may achieve. FIG. 7 illustrates several examples of controlling the phases and amplitudes of an output signal in different subsections by varying the delta currents for each subsection. In this case, again, there are four reference signals, dividing the phase range P of 360° into four sections 131, 132, 133, 134. To simplify the discussion, each section 131, 132, 133, 134 is further divided into two subsections. In subsections 711 and 712, the amplitudes at different phases of the output signal are closer to a nominal amplitude. In subsections 721 and 722, the amplitudes at different phases of the output signal are somewhat greater than the nominal amplitude. In subsections 731 and 732, the amplitudes at different phases of the output signal are somewhat less than the nominal amplitude. This may be achieved by selecting different delta currents, and thus selecting different relative gains, for the different subsections. In addition, the relative weights of the two subsections within each section are set to be reciprocal, so that a reasonably good approximation of a circular phase diagram may be achieved with a relatively simple circuit. Typically, but not necessarily, the relative gains (i.e., the ratio of the delta currents) are selected to be equal in the four quadrants. In other words, all relative gains for control codes that differ only in the top two most significant bits (MSBs) are the same. In addition, typically, but not necessarily, the relative gains (i.e., the ratio of the delta currents) are selected to be reciprocal to the relative gains for 1-complementary control codes in each quadrant. In other words, the product of the relative gains of any two control codes in quadrant whose sum equals to the largest code (e.g. code 11111=31 for 5-bit per quadrant) is one.

In some implementations, given a subsection within the phase range P of a phase interpolator that is located between two reference signals (e.g., reference signals i and j), two delta currents (e.g., denoted as $\Delta I_i$ and $\Delta I_j$) may be determined for the two reference signals i and j, respectively, for the subsection. In particular embodiments, a global delta current (e.g., denoted as $\Delta I$) may be selected for the phase interpolator (e.g., based on experiments or practical requirements of the phase interpolator). Then, there may be two control values (e.g., denoted as $ctrl_i$ and $ctrl_j$) selected for the two reference signals i and j, respectively, such that $\Delta I_i = ctrl_i \times \Delta I$ and $\Delta I_j = ctrl_j \Delta I$. This means that there is a relationship between $\Delta I_i$ and $\Delta I_j$, such that $$\Delta I_j = \Delta I_i \times \frac{ctrl_j}{ctrl_i} \text{ or } \Delta I_i = \Delta I_j \times \frac{ctrl_i}{ctrl_j}.$$

Let $$ctrl = \frac{ctrl_j}{ctrl_i}.$$

Then, in particular embodiments, ctrl may be determined as the absolute value of the tangent of the phase of an output signal in the subsection.

Figure 8:
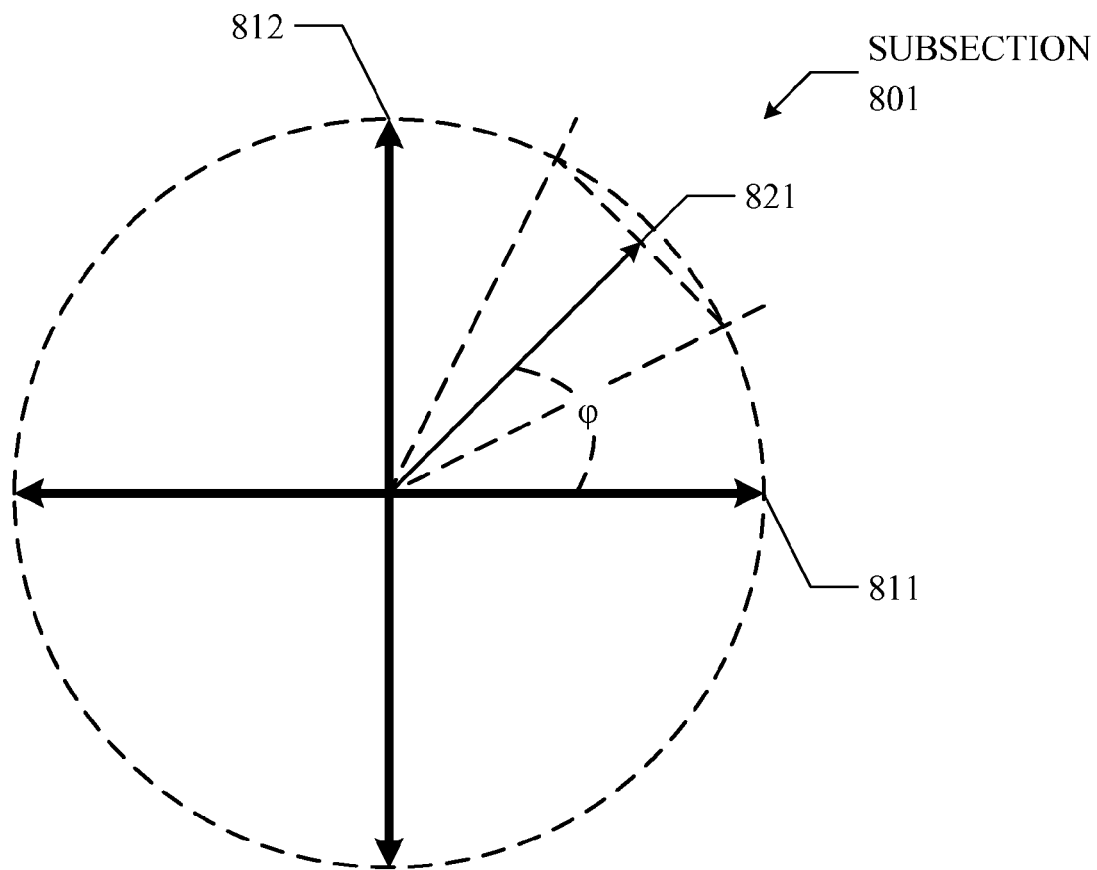
FIG. 8 illustrates an example subsection within a phase range.

To explain the relationship between two the delta currents selected for a subsection further, consider the example illustrated in FIG. 8. A subsection 801 is located between two reference signals 811 and 812. An output signal 821 has a phase of ϕ. For a phase ϕ that corresponds to some control code in subsection 801, two delta currents $\Delta I_{811}$ and $\Delta I_{812}$ may be selected for reference signals 811 and 812, respectively, such that $\Delta I_{812} = |\tan \phi| \times \Delta I_{811}$.

Although FIGS. 7 and 8 illustrate producing an output signal with a specific phase by combining two reference signals according to their respective weights as controlled by the control signal, in general, the output signal may be produced using any number (e.g., one or more) of reference signals. For example, in some cases, when the output signal has a phase that is the same as the phase of one of the reference signals (e.g., ϕ=0), it is possible to produce such output signal with only one reference signal (e.g., reference signal 811). In other cases, the output signal may be produced by combining two or more reference signals based on their respective weights. Note that when applicable, the weight assigned to a specific reference signal may be 0.

FIG. 9 illustrates an example method for constructing a phase interpolator, which summarizes the process described above. Briefly, in particular embodiments, the phase range of a phase interpolator is divided into a number of sections, each section being located between two adjacent reference signals of the phase interpolator. For each section, two delta currents are selected for the two reference signals between which the section is located, respectively.

FIG. 10 illustrates an example method for producing an output signal having a specific phase (e.g., denoted as $\phi_{out}$) using the phase interpolator described above. Particular embodiments may determine the section within which the phase $\phi_{out}$ of the output signal should fall. Since each section is located between two adjacent reference signals, and two delta currents have already been selected for each section corresponding to the two reference signals between which the section is located, for the specific section within which the phase $\phi_{out}$ of the output signal falls, the two reference signals are combined based on the two weights assigned to them (e.g., as indicated by the two corresponding delta currents), respectively, to produce the output signal at phase $\phi_{out}$.

Figure 11:
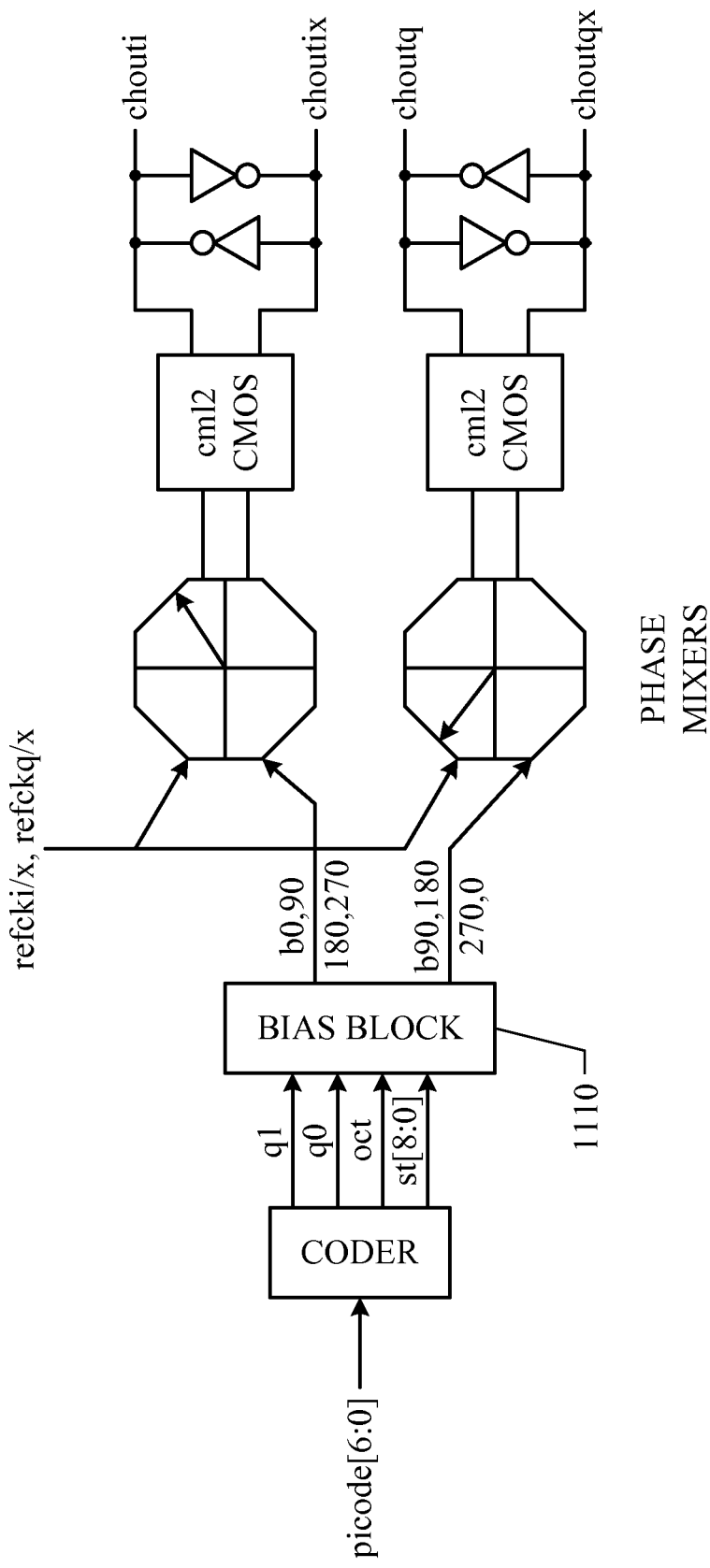
FIG. 11 illustrates an example implementation of a phase interpolator.

In particular embodiments, a phase interpolator as constructed based on the method illustrated in FIG. 9 may be implemented as integrated circuits, an example of which is illustrated in FIG. 11. The circuits may include a bias block 1110, which generates the bias currents (e.g., the delta currents) to the two adjacent reference clock phases of each pair of adjacent reference signals, depending on the section (q1, q0). For the counterclockwise direction, with the input code (e.g., the control signal), the amount of the bias current to the early reference clock phase decreases linearly, while the amount of the bias current to the late reference clock phase increases linearly, with different respective proportionality coefficients. For example, in section 711 illustrated in FIG. 7, the rate of decrease of the bias current to the early clock phase is slower than the rate of increase of the bias current to the late clock phase. On the other hand, in section 712 illustrated in FIG. 7, the rate of decrease of the bias current to the early clock phase is faster than the rate of increase of the bias current to the late clock phase.

Herein, reference to a computer-readable storage medium encompasses one or more non-transitory, tangible computer-readable storage media possessing structure. As an example and not by way of limitation, a computer-readable storage medium may include a semiconductor-based or other integrated circuit (IC) (such, as for example, a field-programmable gate array (FPGA) or an application-specific IC (ASIC)), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. Herein, reference to a computer-readable storage medium excludes any medium that is not eligible for patent protection under 35 U.S.C. §101. Herein, reference to a computer-readable storage medium excludes transitory forms of signal transmission (such as a propagating electrical or electromagnetic signal per se) to the extent that they are not eligible for patent protection under 35 U.S.C. §101. A computer-readable non-transitory storage medium may be volatile, non-volatile, or a combination of volatile and non-volatile, where appropriate.

This disclosure contemplates one or more computer-readable storage media implementing any suitable storage. In particular embodiments, a computer-readable storage medium implements one or more portions of processor ~02 (such as, for example, one or more internal registers or caches), one or more portions of memory ~04, one or more portions of storage ~06, or a combination of these, where appropriate. In particular embodiments, a computer-readable storage medium implements RAM or ROM. In particular embodiments, a computer-readable storage medium implements volatile or persistent memory. In particular embodiments, one or more computer-readable storage media embody software. Herein, reference to software may encompass one or more applications, bytecode, one or more computer programs, one or more executables, one or more instructions, logic, machine code, one or more scripts, or source code, and vice versa, where appropriate. In particular embodiments, software includes one or more application programming interfaces (APIs). This disclosure contemplates any suitable software written or otherwise expressed in any suitable programming language or combination of programming languages. In particular embodiments, software is expressed as source code or object code. In particular embodiments, software is expressed in a higher-level programming language, such as, for example, C, Perl, or a suitable extension thereof. In particular embodiments, software is expressed in a lower-level programming language, such as assembly language (or machine code). In particular embodiments, software is expressed in JAVA, C, or C++. In particular embodiments, software is expressed in Hyper Text Markup Language (HTML), Extensible Markup Language (XML), or other suitable markup language.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A phase interpolator with a phase range of n degrees, where $0<n \leq 360$, and having m reference signals, where $m \geq 2$, and a control signal as input, and configured to produce an output signal with a phase within the phase range using one or more of the m reference signals based on a control code provided by the control signal, the phase interpolator comprising one or more circuits configured to:
    divide the phase range of n degrees into k sections, wherein:
        $k>m$;
        at least two of the k sections exist between any two of the m reference signals; and
        each section includes a possible output of at least two output signals resulting from respective control codes; and
    for each of the k sections, select a relative gain of one or more weights assigned to the one or more reference signals, respectively, with respect to the control code provided by the control signal, wherein the relative gain for a given one of the k sections is unequal to relative gains applied to adjacent ones of the k sections.

2. The phase interpolator of claim 1, wherein for each of the k sections,
    the relative gain is determined as a ratio between weight changes of any two reference signals within the section with respect to the control signal.

3. The phase interpolator of claim 1, wherein for each of the k sections,
    for each phase within the section, a weight is assigned to a reference signal based on the relative gain of the section.

4. The phase interpolator of claim 3, wherein for each of the k sections,
    for each phase within the section, the output signal at the phase is obtained by combining two or more of the m reference signals based on their respective weights.

5. The phase interpolator of claim 1, wherein for each of the k sections, the relative gain of the two weights assigned to the reference signals with respect to the control code equals tangent of a phase within the section and weights assigned to other reference signals equal to zero.

6. A method comprising, by a phase interpolator with a phase range of n degrees, where $0<n \leq 360$, and having m reference signals, where $m \geq 2$, and a control signal as input, and configured to produce an output signal with a phase within the phase range by using one or more of the m reference signals based on a control code provided by the control signal:
    dividing the phase range of n degrees into k sections, wherein:
        $k>m$;
        at least two of the k sections exist between any two of the m reference signals; and
        each section includes a possible output of at least two output signals resulting from respective control codes; and
    for each of the k sections, selecting a relative gain of one or more weights assigned to the one or more reference signals, respectively, with respect to the control code provided by the control signal, wherein the relative gain for a given one of the k sections is unequal to relative gains applied to adjacent ones of the k sections.

7. The method of claim 6, wherein:

each of the m reference signals has a phase $\phi$, where $0 \le \phi \le n$, and the m reference signals divide the phase range of n degrees into m parts.

8. The method of claim 7, wherein dividing the phase range of n degrees into k sections comprises dividing each of the m parts into two or more of the k sections.

9. The method of claim 7, wherein each of the k sections is located between two adjacent ones, in terms of their phases, of the m reference signals.

10. The method of claim 6, wherein for each of the k sections, the relative gain of the two weights assigned to the reference signals with respect to the control code equals tangent of a phase within the section and weights assigned to other reference signals equal to zero.

11. The method of claim 6, further comprising producing an output signal having a phase $\phi_{out}$ by the phase interpolator, comprising:

determining a first one of the k sections within which $\phi_{out}$ falls;

accessing a first one of the m reference signals having a first current $I_1$ and a second one of the m reference signals having a second current $I_2$ between which the first section is located;

accessing a first delta current $\Delta I_1$ selected for the first current $I_1$ and a second delta current $\Delta I_2$ selected for the second current $I_2$;

adjusting the first current $I_1$ based on the first delta current $\Delta I_1$ and the second current $I_2$ based on the second delta current $\Delta I_2$; and combining the adjusted first signal and the adjusted second signal to produce the output signal.

12. The method of claim 6, wherein n=360 and m≥3.

* * * * *